US 6,538,442 B2

(12) United States Patent
Boskamp

(10) Patent No.: US 6,538,442 B2
(45) Date of Patent: Mar. 25, 2003

(54) MRI SYSTEM HAVING RF SHIELDING GRADIENT COIL STRUCTURE

(75) Inventor: Eddy B. Boskamp, Menomonee Falls, WI (US)

(73) Assignee: GE Medical Systems Global Technology Company, Waukesha, WI (US)

( * ) Notice: Subject to any disclaimer, the term of this patent is extended or adjusted under 35 U.S.C. 154(b) by 0 days.

(21) Appl. No.: 09/747,542

(22) Filed: Dec. 22, 2000

(65) Prior Publication Data

US 2002/0093337 A1 Jul. 18, 2002

(51) Int. Cl.[7] ................................................ G01V 3/00
(52) U.S. Cl. ...................... 324/318; 324/307; 324/309; 324/320; 324/322
(58) Field of Search ................................ 324/318, 320, 324/322, 307, 309

(56) References Cited

U.S. PATENT DOCUMENTS 4,638,253 A * 1/1987 Jaskolski et al. ........... 324/311
5,349,744 A * 9/1994 Takahashi .................. 29/602.1
5,990,681 A * 11/1999 Richard et al. ............. 324/318
6,144,204 A * 11/2000 Sementchenko ............ 324/318
6,249,121 B1 * 6/2001 Boskamp et al. ........... 324/318

* cited by examiner

Primary Examiner—Edward Lefkowitz
Assistant Examiner—Dixomara Vargas
(74) Attorney, Agent, or Firm—Fletcher, Yoder & Van Someren

(57) ABSTRACT

A combination gradient coil/RF shield is provided for magnetic resonance imaging systems. The coil may be adapted from any of the existing gradient coil structures, but is preferably an X-axis or Y-axis coil, with an inner Z-axis coil being inherently decoupled from the RF magnetic field due to its design. Capacitive circuits are provided between conductive paths of the selected gradient coil to adapt the gradient coil to the RF frequencies used during operation, such as 64 MHz. The technique permits the gradient coil assembly to be affectively moved closer to the patient while providing an enhanced distance between the RF coil and the RF shield defined by the adapted gradient coil.

21 Claims, 3 Drawing Sheets

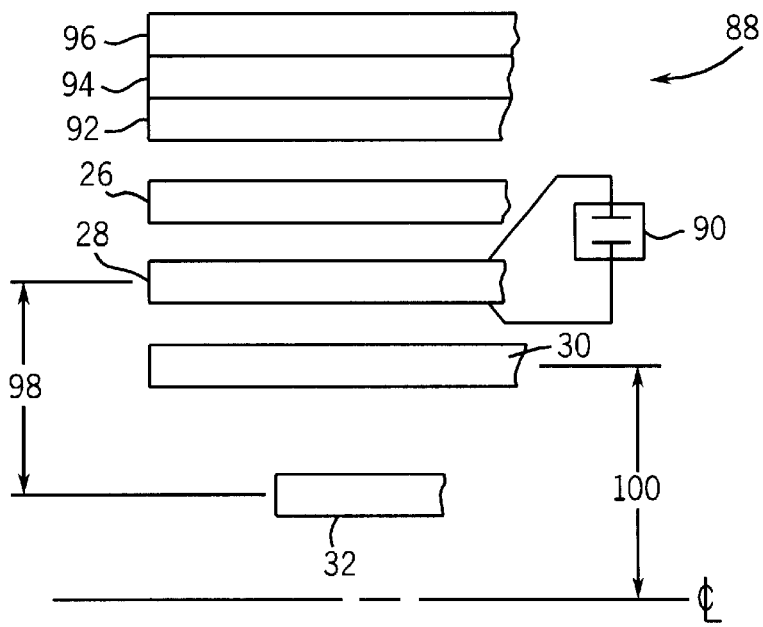
FIG 4
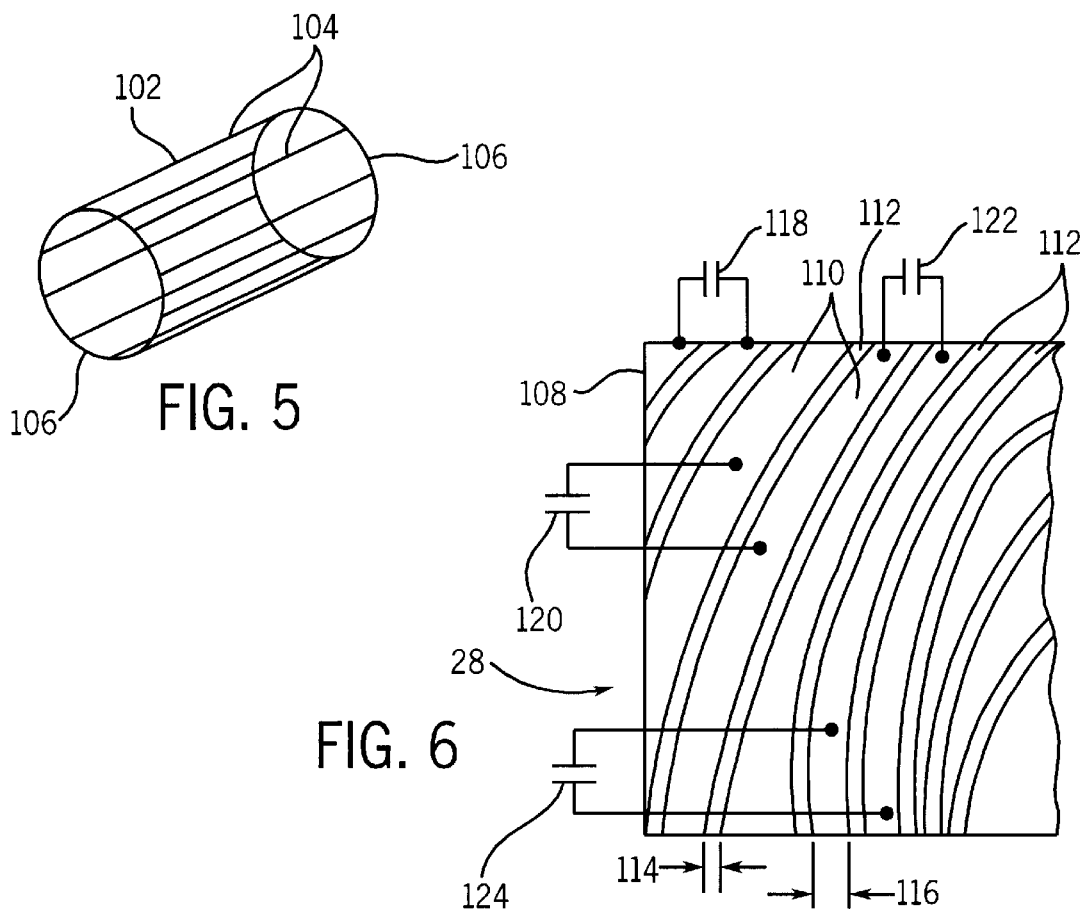
FIG. 5
FIG. 6

MRI SYSTEM HAVING RF SHIELDING GRADIENT COIL STRUCTURE

FIELD OF THE INVENTION

The present invention relates generally to magnetic resonance imaging systems, such as those used for medical diagnostic applications. More particularly, the invention relates to a technique for shielding radio frequency magnetic fields in MRI systems via an adapted gradient field coil which serves to produce the desired gradient fields, while shielding RF energy.

BACKGROUND OF THE INVENTION

Magnetic resonance imaging (MRI) systems have become ubiquitous in the field of medical diagnostics. Over the past decades, improved techniques for MRI examinations have been developed that now permit very high quality images to be produced in a relatively short time. As a result, diagnostic images with varying degrees of resolution are available to the radiologist that can be adapted to particular diagnostic applications.

In general, MRI examinations are based on the interactions among a primary magnetic field, a radio frequency (RF) magnetic field and time varying magnetic field gradients with nuclear spins within the subject of interest. The nuclear spins, such as hydrogen nuclei in water molecules, have characteristic behaviors in response to external magnetic fields. The precession of such nuclear spins can be influenced by manipulation of the fields to obtain RF signals that can be detected, processed, and used to reconstruct a useful image.

The magnetic fields used to produce images in MRI systems include a highly uniform, primary magnetic field that is produced by a magnet. A series of gradient fields are produced by a set of three coils disposed around the subject. The gradient fields encode positions of individual volume elements or voxels in three dimensions.

A radio frequency coil is employed to produce an RF magnetic field. This RF magnetic field perturbs the spin system from its equilibrium direction, causing the spins to precess around the axis of their equilibrium magnetization. During this precession, radio frequency fields are emitted by the spins and are detected by either the same transmitting RF coil, or by a separate receive-only coil. These signals are amplified, filtered, and digitized. The digitized signals are then processed using one of several possible reconstruction algorithms to form a final image.

Many specific techniques have been developed to acquire MR images for a variety of applications. One major difference among these techniques is in the way gradient pulses and RF pulses are used to manipulate the spin systems to yield different image contrasts, signal-to-noise ratios, and resolutions. Graphically, such techniques are illustrated as "pulse sequences" in which the pulses are represented along with temporal relationships among them. In recent years, pulse sequences have been developed which permit extremely rapid acquisition of a large amount of raw data. Such pulse sequences permit significant reduction in the time required to perform the examinations. Time reductions are particularly important for acquiring high resolution images, as well as for suppressing motion effects and reducing the discomfort of patients in the examination process.

A difficulty which arises in MRI systems involves the interaction between the RF magnetic field and the surrounding gradient coil structures. In particular, the RF magnetic field can penetrate into the gradient coil structures and, due to the very lossy nature of these structures, can be dissipated if not otherwise shielded. The loss of RF energy can result in the need to boost input levels to the RF coil to obtain the desired field strength. However, higher energy levels imply higher powered amplifiers used to drive the RF coil, and can lead to excessive energy levels which are undesireable within the patient bore of the scanner.

Heretofore known techniques for limiting RF energy loss in MRI systems have included various shield configurations placed within the gradient coil assembly. The RF shields prevent or considerably reduce penetration of the RF magnetic field into the gradient coil assemblies, thereby reducing RF energy losses. However, the placement of RF shields within the gradient coil assembly results in relatively close proximity between the RF shield and the RF coil. Such placement reduces the effectiveness of the coil somewhat, as well as the efficiency of the gradient coils, which must be placed radially beyond the RF shield.

There is a need, therefore, for an improved technique for shielding RF magnetic fields in MRI systems. There is a particular need, at present, for a technique which will limit energy losses within the gradient coils, while enhancing the efficiency of both the RF shield and the gradient coils by judicious placement of the shielding structure with respect to the patient bore and RF coil.

SUMMARY OF THE INVENTION

The present invention provides a novel technique for RF shielding in MRI systems designed to respond to these needs. The technique may be employed in new systems, but may also be retrofitted to existing systems where desired. The technique offers a combined gradient coil/RF shield structure which reduces or eliminates the need for a separate RF shield. In one embodiment, an inner gradient coil, such as a Z-axis coil which is inherently decoupled from the RF magnetic field due to the orientation of its field, is placed at an innermost location within the gradient coil assembly. One of the remaining two gradient coils, preferably the gradient coil adjacent to the Z-axis coil, is adapted to provide shielding at the RF frequencies, while still performing its functions in producing the desired gradient fields.

The combination gradient coil/RF shield includes a conductor or conductors supported on a support structure, such as a non-conductive tube. The gradient coil conductor is rendered reflective of energy at the radio frequencies by capacitors linked between the conductive paths formed by the conductor. The circuit thus defined by the capacitors and conductor serves as a shield at radio frequencies, while allowing gradient fields at the much lower frequencies of gradient coil operation to be formed in a conventional manner.

BRIEF DESCRIPTION OF THE DRAWINGS

FIG. 4 is a diagrammatical representation of a portion of a gradient coil assembly including a coil adapted to serve as an RF shield in accordance with aspects of the present technique;

FIG. 5 is a diagrammatical perspective view of an exemplary RF coil configuration of the type which may be used with the shielding gradient coil of the present technique; and FIG. 6 is a diagrammatical representation of a portion of a gradient coil including capacitive circuits for modifying the gradient coil for RF shielding purposes.

DETAILED DESCRIPTION OF THE INVENTION

Figure 1:
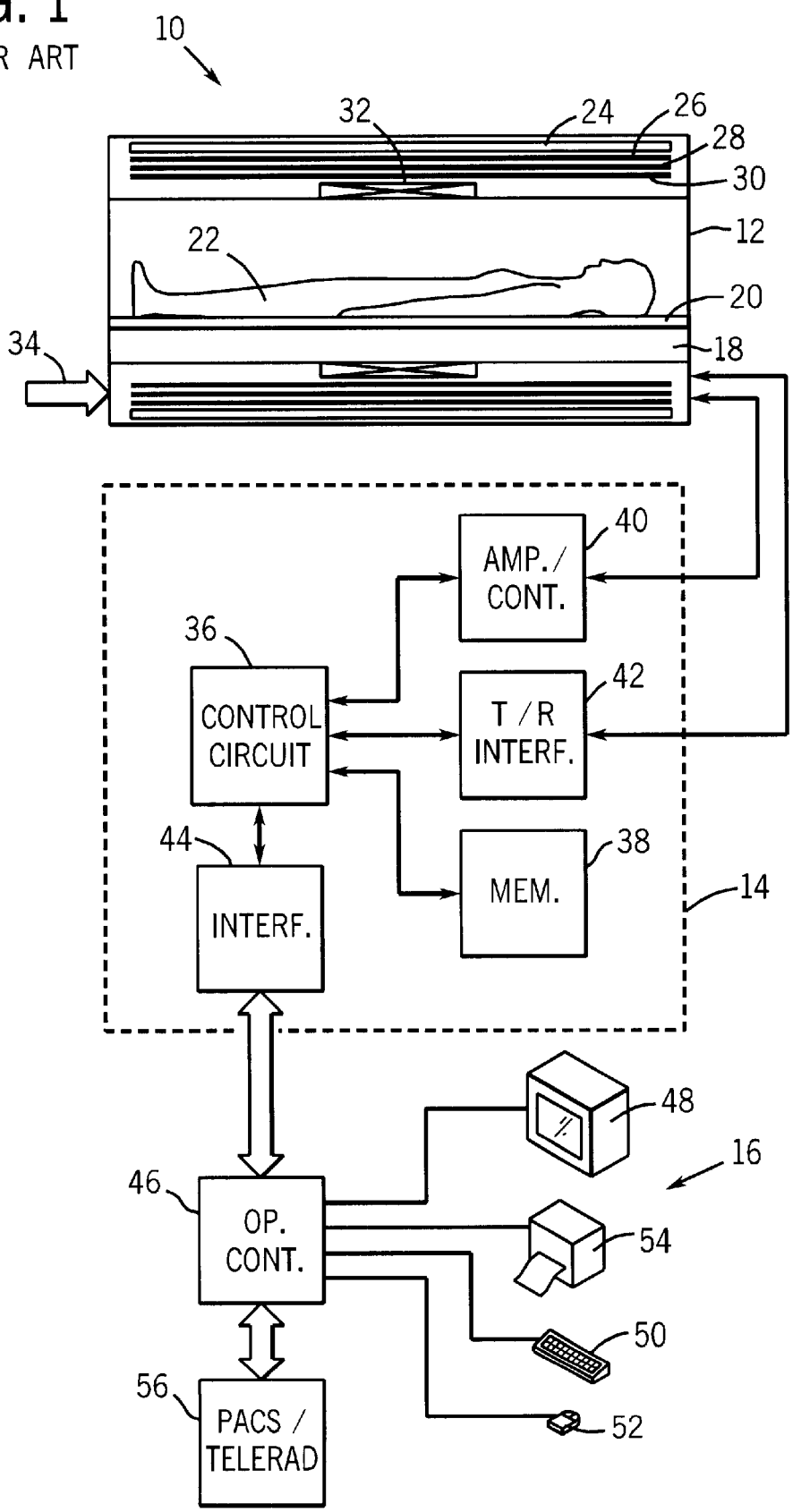
FIG. 1 is a diagrammatical representation of an MRI system for use in medical diagnostic imaging and implementing certain aspects of the present invention.

Turning now to the drawings, and referring first to FIG. 1, a magnetic resonance imaging (MRI) system 10 is illustrated diagrammatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desired position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radio frequency excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. A radio frequency coil 32 is provided for generating radio frequency pulses for exciting the gyromagnetic material. In the embodiment illustrated in FIG. 1, coil 32 also serves as a receiving coil. Thus, RF coil 32 may be coupled with driving and receiving circuitry in passive and active modes for receiving emissions from the gyromagnetic material and for outputting radio frequency excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

As described more fully below, at least one of the gradient coils of the coil assembly is adapted to serve as an RF shield to limit penetration of the RF magnetic field into the gradient coil assembly. In a presently contemplated embodiment, the innermost gradient coil 30 is a Z-axis coil wound as a solenoid-like structure which has little impact on the RF field in operation due to the orthogonal orientation of the RF and Z-axis gradient field. The second gradient coil 28, which may be either the X-axis coil or the Y-axis coil, is adapted to serve both as a gradient coil and as an RF shield. The other coils of the assembly may be conventional in construction and operation. The combination gradient coil/RF shield thus provides enhanced performance and greater energy efficiencies as detailed below.

The coils of scanner 12 are controlled by external circuitry to generate desired fields and pulses, and to read emissions from the gyromagnetic material in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a linear variation in the overall magnetic field strength across the field of view. Combinations of such fields, orthogonally disposed with respect to one another, enable the creation of a linear gradient in any direction by vector addition of the individual gradient fields.

The gradient fields may be considered to be oriented both in physical planes, as well as by logical axes. In the physical sense, the fields are mutually orthogonally oriented to form a coordinate system which can be rotated by appropriate manipulation of the pulsed current applied to the individual field coils. In a logical sense, the coordinate system defines gradients which are typically referred to as slice select gradients, frequency encoding gradients, and phase encoding gradients.

The slice select gradient determines a slab of tissue or anatomy to be imaged in the patient. The slice select gradient field may thus be applied simultaneous with a selective RF pulse to excite a known volume of spins within a desired slice that precess at the same frequency. The slice thickness is determined by the bandwidth of the RF pulse and the gradient strength across the field of view.

A second logical gradient axis, the frequency encoding gradient axis is also known as the readout gradient axis, and is applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position across the gradient field. By Fourier transformation, acquired signals may be analyzed to identify their location in the selected slice by virtue of the frequency encoding.

Finally, the phase encode gradient is generally applied in a sequence before the readout gradient and after the slice select gradient. Localization of spins in the gyromagnetic material in the phase encode direction is accomplished by sequentially inducing variations in phase of the precessing protons of the material by using slightly different gradient amplitudes that are sequentially applied during the data acquisition sequence. Phase variations are thus linearly imposed across the field of view, and spatial position within the slice is encoded by the polarity and the degree of phase difference accumulated relative to a null position. The phase encode gradient permits phase differences to be created among the spins of the material in accordance with their position in the phase encode direction.

As will be appreciated by those skilled in the art, a great number of variations may be devised for pulse sequences employing the logical axes described above. Moreover, adaptations in the pulse sequences may be made to appropriately orient both the selected slice and the frequency and phase encoding to excite the desired material and to acquire resulting MR signals for processing.

The coils of scanner 12 are controlled by scanner control circuitry 14 to generate the desired magnetic field and radio frequency pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving RF coil 32. Moreover, where the RF coil serves both to emit the radio frequency excitation pulses and to receive MR signals, circuitry 42 will typically include a switching device for toggling the RF coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a cylindrical bore imaging system employing a superconducting primary field magnet assembly, the present technique may be applied to various other configurations, such as scanners employing vertical fields with permanent magnets and electromagnets.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, teleradiology systems, and the like.

Figure 2:
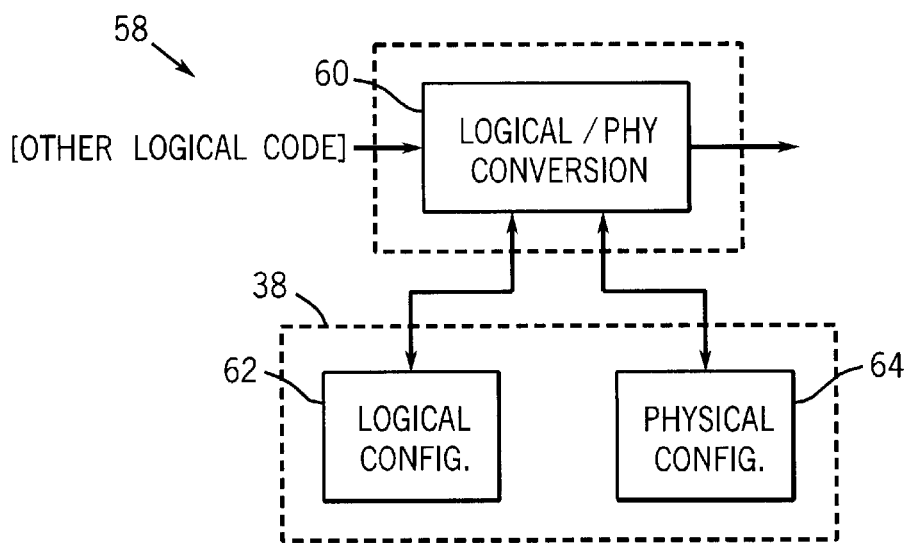
FIG. 2 is a block diagram of functional components of a pulse sequence description module in a controller for a system of the type illustrated in FIG. 1.

In general, these pulse sequences implemented in the MRI system will be defined by both logical and physical configuration sets and parameter settings stored within control circuitry 14. FIG. 2 represents, diagrammatically, relationships between functional components of control circuit 36 and configuration components stored with memory circuitry 38. The functional components facilitate coordination of the pulse sequences to accommodate preestablished settings for both logical and physical axes of the system. In general, the axis control modules, denoted collectively by reference numeral 58, include a logical-to-physical module 60 which is typically implemented via software routines executed by control circuit 36. In particular, the conversion module is implemented through control routines which define particular pulse sequences in accordance with preestablished imaging protocols.

When called upon, code defining the conversion module references logical configuration sets 62 and physical configuration sets 64. The logical configuration sets may include parameters such as pulse amplitudes, beginning times, time delays, and so forth, for the various logical axes described above. The physical configuration sets, on the other hand, will typically include parameters related to the physical constraints of the scanner itself, including maximum and minimum allowable currents, switching times, amplification, scaling, and so forth. Conversion module 60 serves to generate the pulse sequence for driving the coils of scanner 12 in accordance with constraints defined in these configuration sets. The conversion module will also serve to define adapted pulses for each physical axis to properly orient (e.g. rotate) slices and to encode gyromagnetic material in accordance with desired rotation or reorientations of the physical axes of the image.

Figure 3:
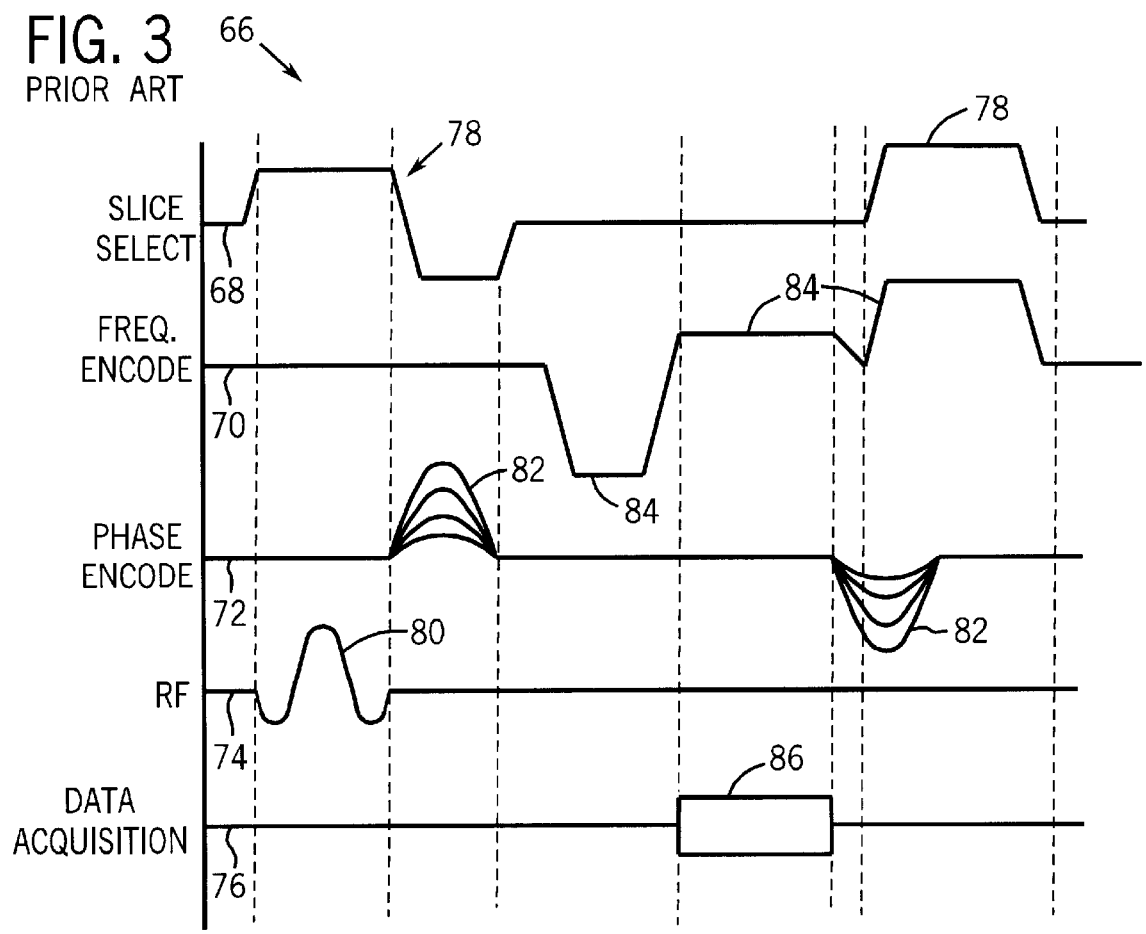
FIG. 3 is a graphical representation of an exemplary pulse sequence description for an MRI examination which may be implemented in the system of FIG. 1.

By way of example, FIG. 3 illustrates a typical pulse sequence which may be implemented on a system such as that illustrated in FIG. 1 and calling upon configuration and conversion components such as those shown in FIG. 2. While many different pulse sequence definitions may be implemented, depending upon the examination type, in the example of FIG. 3, a gradient recalled acquisition in steady state mode (GRASS) pulse sequence is defined by a series of pulses and gradients appropriately timed with respect to one another. The pulse sequence, indicated generally by reference numeral 66, is thus defined by pulses on a logical slice select axis 68, a frequency encoding axis 70, a phase encoding axis 72, an RF axis 74, and a data acquisition axis 76. In general, the pulse sequence description begins with a pair of gradient pulses on slice select axis 68 as represented at reference numeral 78. During a first of these gradient pulses, an RF pulse 80 is generated to excite gyromagnetic material in the subject. Phase encoding pulses 82 are then generated, followed by a frequency encoding gradient 84. A data acquisition window 86 provides for sensing signals resulting from the excitation pulses which are phase and frequency encoded. The pulse sequence description terminates with additional gradient pulses on the slice select, frequency encoding, and phase encoding axes.

As pulse sequences are applied to the gradient and RF coils of the system, coupling may occur between the RF magnetic field and certain of the gradient coils. In particular, as noted above, where the innermost gradient coil 30 is a Z-axis coil, coupling will not generally occur in such a manner that could dissipate RF energy. However, the X- and Y-axis coils may undergo coupling which can significantly affect the useful energy applied to the RF coil and the strength of the field generated by the coil. To avoid such coupling, the present technique adapts at least one of the gradient coils to serve as an RF shield which limits penetration of the RF magnetic field into the gradient coil assembly.

FIG. 4 is a diagrammatical representation of a gradient coil assembly including an RF shielding gradient coil in accordance with aspects of the present technique. As shown in FIG. 4, the coil assembly 88, which includes the gradient coils 26, 28 and 30 described above, is adapted so as to permit the generation of the required gradient field, but also to shield the magnetic field generated by the RF coil 32 during operation. Accordingly, as represented diagrammatically in FIG. 4, a capacitive circuit or network 90 is coupled to one of the gradient coils, such as X-axis coil 28. In the illustrated embodiment, the innermost gradient coil 30 is a Z-axis coil which is inherently decoupled from the magnetic field generated by the RF coil 32 due to its configuration and the orientation of the field it produces. One of the remaining gradient coils, such as the X-axis coil 28 is adapted to serve as the combination gradient coil/RF shield. The capacitive network 90 includes a series of circuits as described more fully below which adapt the coil 28 to act as a shield at the RF frequencies, such as approximately 64 MHz in certain applications (although the frequency may depend upon the system design and the type of gryomagnetic material of interest, and may vary widely, such as between 8 and 270 MHz). Thus, the coil and capacitive network assembly serve as a shield at RF frequencies used during operation of the scanner, while being generally unaffected at the frequencies used to generate the desired gradient field.

In the illustrated embodiment, gradient coil assembly 88 also includes outer gradient coils 92, 94 and 96 which are placed within the primary magnet discussed above (see FIG. 1). The provision of a combination gradient coil/RF shield as defined by coil 28 in the embodiment of FIG. 4, permits the resulting coil assembly geometry to be optimized as compared to existing systems. In particular, the distance between the effective RF shield provided by gradient coil 28 and the RF coil 32 is increased as represented by reference numeral 98 in FIG. 4. This increased distance allows for improved efficiency of the RF coil, improvement in the resulting signal-to-noise ratio, and, where desired, the use of a smaller RF amplifier or the application of reduced amplitude pulses to the RF coil to obtain the desired RF magnetic field. Similarly, the structure allows for an improved (i.e., reduced) distance 100 between the innermost gradient coil 30 and the center line of the patient bore, as represented generally by reference numeral 100.

FIG. 5 represents an exemplary RF coil structure which may be used in conjunction with the gradient coil assembly illustrated in FIG. 4. As noted above, any suitable RF coil may be employed with the present shielding technique. However, in the embodiment illustrated in FIG. 5, a birdcage coil structure 102 is employed as an exemplary whole body coil. As will be appreciated by those skilled in the art, such coil structures include longitudinal conductors 104 coupled to conductive end ring 106. Controlled pulses to the conductors are driven to rotate the RF field at a desired frequency, such as 64 MHz during operation.

As discussed above, in accordance with the present technique, one of the gradient coils of the gradient coil assembly is adapted to serve as an RF shield, that is, to reflect energy at RF frequencies so as to prevent or reduce penetration of the RF magnetic field into the gradient coil structure and the consequence loss of RF energy. FIG. 6 represents, diagrammatically, a presently contemplated modified gradient coil adapted to serve as an RF shield. As shown in FIG. 6, the coil is the X-axis coil 28, although the Y-axis coil may also be adapted to shield at RF frequencies, or both coils may be adapted in this manner. In general, the remaining coil, wound as a solenoid-like structure, will be inherently decoupled from the RF magnetic field, and will generally have little effect on the RF energy.

In the embodiment of FIG. 6, and as will be appreciated by those skilled in the art, coil 28 includes a non-conductive support 108, such as a fiberglass and resin tube on which one or more conductors 110 are mounted. The conductors 110 are formed and disposed on the support in conductive bands or paths which are separated by gaps 112, typically on the order of 2.5 mm to 5.0 mm. The conductors are typically made of copper or a copper alloy which, owing to the form and placement of the conductive paths, produce the desired gradient magnetic field when pulsed at appropriate frequencies during operation. The specific dimensions of the gaps 112, as indicated by reference numeral 114 in FIG. 6, and of the width 116 of the conductive paths defined by conductor 110, may be varied in accordance with the specific design of the gradient coil. A number of different designs are generally know in the art and may be provided in accordance with the present technique.

Because the circuit defined by the conductors 110 of the gradient coil is not generally adapted to serve as an RF shield, capacitors 118, 120, 122 and 124 are placed at appropriate locations and link to the conductive paths of the conductor 110 to form an appropriate capacitive network and to render the coil and effective shield at the RF frequencies. In the illustrated embodiment, the capacitive circuits defined by capacitors 118, 120, 122 and 124 are formed between adjacent conductive paths of the conductor 110. In practice, however, the placement and connection of the capacitive circuits may call for capacitances to be provided between non-adjacent paths, and at various locations around the gradient coil.

In a presently contemplated implementation, the capacitors used to adapt the gradient coil to serve as an RF shield are chosen such they effectively create a short at RF frequencies, but maintain a high impedance at the gradient frequencies (such as approximately 1 KHz). Also in a presently contemplated embodiment, capacitances on the order of 1 nF are selected and positioned at locations where, based upon calculation of RF current density in a continuous shield, the highest RF currents would be expected. In the case of a birdcage RF coil, this would typically correspond to locations in the proximity of end rings 106.

As will be appreciated by those skilled in the art, the modification of the gradient coil structure for the RF shielding purposes contemplated herein may also require capacitors of different capacitance ratings to be employed, depending upon the location and distribution of the RF field, the design of the gradient coil and its conductors, and so forth. In general, however, a series of capacitors are coupled to the conductors of the gradient coil, and the rating and locations of the capacitors are selected to provide the appropriate shielding. The specific capacitor ratings, and their placements, are subject to adaptation depending upon the specific gradient coil design, and may be selected without undue experimentation. The present technique contemplates that the capacitors may be provided, mounted, and incorporated into the gradient coil assembly during manufacture, with the resulting coil being subsequently incorporated into the overall gradient coil assembly. Where desired, gradient coils may also be retrofitted with capacitive circuits as set forth above, such as to enhance performance of existing systems.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A magnetic resonance imaging scanner comprising:
   a primary magnet for generating a primary magnetic field; and
   a gradient coil assembly including first, second and third gradient coils disposed successively inwardly of one another, one of the gradient coils being disposed intermediate an RF coil and at least one other gradient coil and being configured to generate a desired gradient field and to act as an RF shielding gradient coil for the at least one other gradient coil of the assembly.

2. The scanner of claim 1, wherein the gradient coils are assembled into a tubular structure with the RF shielding gradient coil being at a radially interior position with respect to the at least one other gradient coil shielded by the RF shielding gradient coil.

3. The scanner of claim 1, wherein the RF shielding gradient coil is the second gradient coil and is disposed between the first and third gradient coils.

4. The scanner of claim 1, wherein the RF shielding gradient coil is an X-axis or a Y-axis coil.

5. The scanner of claim 1, wherein the RF shielding gradient coil includes a conductive element disposed in a plurality of legs, and a plurality of capacitive circuits coupled between legs to adapt the shielding gradient coil to RF frequencies.

6. The scanner of claim 1, further comprising an RF coil disposed within the primary magnetic field for generating RF fields during an imaging sequence.

7. The scanner of claim 6, further comprising a system controller for regulating application of controlled pulses to the gradient coils and to the RF coil during the imaging sequence.

8. A magnetic resonance imaging system comprising:
   means for generating controlled gradient fields and, in a gradient coil structure, for shielding RF magnetic fields produced by an RF field coil, including a gradient coil configured to generate one of the gradient fields disposed intermediate at least one other gradient coil and the RF field coil;
   means for applying controlled gradient field pulses to the means for generating controlled gradient fields-in the presence of a primary magnetic field;
   means for applying controlled RF field pulses to the RF field coil; and
   means for detecting emissions from a subject of interest resulting from application of the gradient and RF field pulses.

9. The system of claim 8, wherein the means for generating controlled gradient fields includes gradient coils assembled into a tubular structure with the RF shielding gradient coil being at a radially interior position with respect to the at least one other gradient coil shielded by the RF shielding gradient coil.

10. The system of claim 9, wherein gradient coils include first, second and third gradient coils, and wherein the RF shielding gradient coil is the second gradient coil and is disposed between the first and second gradient coils.

11. The system of claim 9, wherein the gradient coils include X-axis, Y-axis and Z-axis gradient coils, and wherein the RF shielding gradient coil is the X-axis or the Y-axis coil.

12. The system of claim 8, wherein RF shielding gradient coil includes a conductive element disposed in a plurality of legs, and a plurality of capacitive circuits coupled between legs to adapt the shielding gradient coil to RF frequencies.

13. A magnetic resonance imaging scanner comprising:
   a primary magnet for generating a primary magnetic field;
   a coil assembly including first, second and third gradient coils disposed successively inwardly of one another and an RF coil disposed inwardly of the gradient coils, one of the gradient coils being disposed intermediate the RF coil and at least one other gradient coil to act as an RF shielding gradient coil for the at least one other gradient coil of the assembly to shield the at least one other gradient coil from field generated by the RF coil during operation.

14. The scanner of claim 13, wherein the gradient coils are assembled into a tubular structure with the RF shielding gradient coil being at a radially interior position with respect to the at least one other gradient coil shielded by the RF shielding gradient coil.

15. The scanner of claim 13, wherein the RF shielding gradient coil is the second gradient coil and is disposed between the first and second gradient coils.

16. The scanner of claim 13, wherein the gradient coils include X-axis, Y-axis and Z-axis gradient coils, and wherein the RF shielding gradient coil is the X-axis or the Y-axis coil.

17. The scanner of claim 16, wherein RF shielding gradient coil includes a conductive element disposed in a plurality of legs, and a plurality of capacitive circuits coupled between legs to adapt the shielding gradient coil to RF frequencies.

18. A magnetic resonance imaging scanner comprising:
   a primary magnet for generating a primary magnetic field; and
   a coil assembly including first, second and third gradient coils disposed successively inwardly of one another and an RF coil disposed inwardly of the gradient coils, one of the gradient coils being disposed intermediate the RF coil and at least one other gradient coil to act as an RF shielding gradient coil for the at least one other gradient coil of the assembly to shield the at least one other gradient coil from field generated by the RF coil during operation, wherein the RF shielding gradient coil includes a conductive element disposed in a plurality of legs, and a plurality of capacitive circuits coupled between legs to adapt the shielding gradient coil to RF frequencies.

19. The scanner of claim 18, wherein the gradient coils are assembled into a tubular structure with the RF shielding gradient coil being at a radially interior position with respect to the at least one other gradient coil shielded by the RF shielding gradient coil.

20. The scanner of claim 18, wherein the RF shielding gradient coil is the second gradient coil and is disposed between the first and second gradient coils.

21. The scanner of claim 18, wherein the gradient coils include X-axis, Y-axis and Z-axis gradient coils, and wherein the RF shielding gradient coil is the X-axis or the Y-axis coil.

* * * * *